(12) United States Patent
Motoyama et al.

(10) Patent No.: US 11,239,076 B2
(45) Date of Patent: Feb. 1, 2022

(54) FILM FORMING METHOD AND HEAT TREATMENT APPARATUS

(71) Applicant: TOKYO ELECTRON LIMITED, Tokyo (JP)

(72) Inventors: Yutaka Motoyama, Nirasaki (JP); Hiroyuki Hayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/815,682

(22) Filed: Mar. 11, 2020

(65) Prior Publication Data
US 2020/0294800 A1  Sep. 17, 2020

(30) Foreign Application Priority Data

Mar. 13, 2019 (JP) .............................. JP2019-046357

(51) Int. Cl.
*H01L 21/02* (2006.01)
*H01L 21/67* (2006.01)
*H01L 21/3065* (2006.01)

(52) U.S. Cl.
CPC .... *H01L 21/02694* (2013.01); *H01L 21/0243* (2013.01); *H01L 21/02236* (2013.01); *H01L 21/02381* (2013.01); *H01L 21/02532* (2013.01); *H01L 21/02592* (2013.01); *H01L 21/02645* (2013.01); *H01L 21/02669* (2013.01); *H01L 21/3065* (2013.01); *H01L 21/67109* (2013.01)

(58) Field of Classification Search
CPC ......... H01L 21/02236; H01L 21/02381; H01L 21/02592; H01L 21/02645; H01L 21/02669; H01L 21/0243; H01L 21/3065; H01L 21/02532
See application file for complete search history.

(56) References Cited

U.S. PATENT DOCUMENTS

2018/0240809 A1* 8/2018 Ye .................... H01L 21/30604
2019/0206679 A1* 7/2019 Maeda .............. H01L 21/02595

FOREIGN PATENT DOCUMENTS

JP  2013-239717 A  11/2013

* cited by examiner

*Primary Examiner* — Quoc D Hoang
(74) *Attorney, Agent, or Firm* — Nath, Goldberg & Meyer; Jerald L. Meyer; Tanya E. Harkins

(57) ABSTRACT

A film forming method includes forming an amorphous semiconductor film on a recess, forming a first polycrystalline semiconductor film by performing heat treatment on the amorphous semiconductor film, and forming a second polycrystalline semiconductor film on the first polycrystalline semiconductor film formed by the heat treatment.

13 Claims, 17 Drawing Sheets

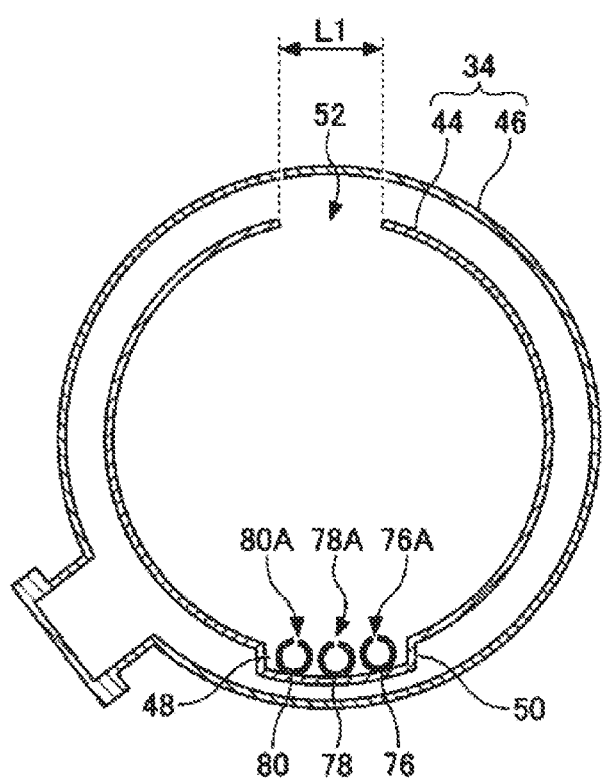

FILM FORMING METHOD AND HEAT TREATMENT APPARATUS

CROSS-REFERENCE TO RELATED APPLICATION

This application is based upon and claims the benefit of priority from Japanese Patent Application No. 2019-046357, filed on Mar. 13, 2019, the entire contents of which are incorporated herein by reference.

TECHNICAL FIELD

The present disclosure relates to a film forming method and a heat treatment apparatus.

BACKGROUND

A technology of forming a film to fill grooves such as holes or trenches with a silicon film by alternately repeating film-forming and etching to the grooves (see e.g., Patent Document 1) has been known.

PRIOR ART DOCUMENT

[Patent Document] Japanese Patent Application Publication No. 2013-239717

SUMMARY

According to embodiments of the present disclosure, there is provided a film forming method including forming an amorphous semiconductor film on a recess, forming a first polycrystalline semiconductor film by performing heat treatment on the amorphous semiconductor film, and forming a second polycrystalline semiconductor film on the first polycrystalline semiconductor film formed by the heat treatment.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a view illustrating a process container of the heat treatment apparatus of FIG. 7.

DETAILED DESCRIPTION

Figure 1A:
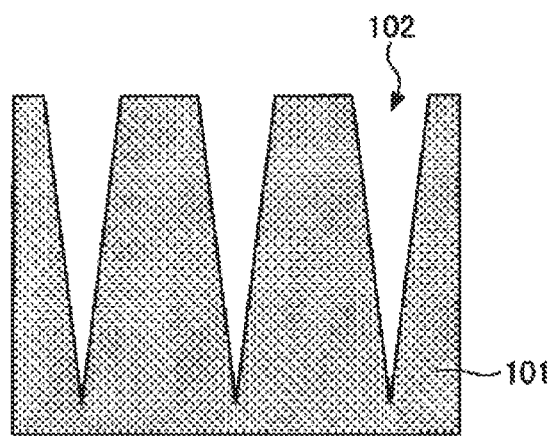
FIGS. 1A to 1E are process cross-sectional views showing a film forming method according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereafter, a non-limiting exemplary embodiment of the present disclosure is described with reference to the accompanying drawings. The same or corresponding members or parts are given the same or corresponding reference numerals throughout the accompanying drawings and repeated description is omitted.

Film Forming Method

First Embodiment

A film forming method according to a first embodiment is described with reference to FIGS. 1A to 1E. FIGS. 1A to 1E are process cross-sectional views showing a film forming method according to the first embodiment.

First, a substrate 101 having recesses 102 on the surface is prepared (see FIG. 1A). The substrate 101 may be, for example, a semiconductor substrate such as a silicon substrate. The recesses 102 may be, for example, trenches or holes. Further, an insulating film such as a silicon oxide film ($SiO_2$ film), a silicon nitride film (SiN film) or the like may be formed on the surfaces of the recesses 102.

Figure 1B:
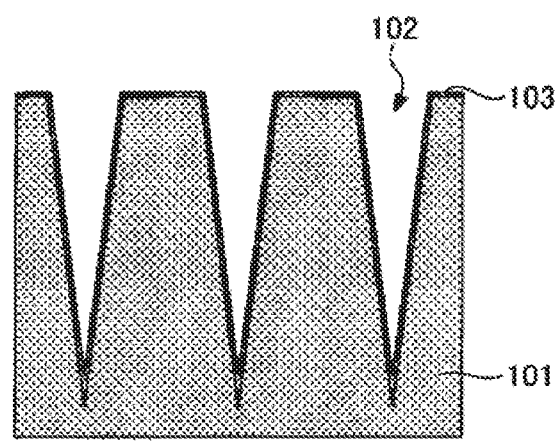

Next, a seed layer 103 is formed on the substrate 101 by supplying a silicon source gas for a seed layer to the substrate 101 (see FIG. 1B). In an embodiment, the seed layer 103 may be formed using aminosilane-based gas as the silicon source gas for the seed layer. The aminosilane-based gas may be, for example, diisopropylamino silane (DIPAS), tris(dimethylamino)silane (3DMAS), and bis(tertiary-butylamino)silane (BTBAS). Further, the seed layer 103 may be formed using a high-order silane-based gas including two or more silicon (Si) in one molecule as the silicon source gas for the seed layer. The high-order silane-based gas may be, for example, $Si_2H_6$, $Si_3H_8$, and $Si_4H_{10}$. Further, the seed layer 103 may be formed using a silicon gas including a hydrogenated silicon gas and a halogen-containing silicon gas as the silicon source gas for the seed layer. The hydrogenated silicon gas may be, for example, $SiH_4$, $Si_2H_6$, and $Si_3H_8$. The halogen-containing silicon gas may be, for example, a fluorine-containing silicon gas such as $SiF_4$, $SiHF_3$, $SiH_2F_2$, and $SiH_3F$, chlorine-containing silicon gas such as $SiCl_4$, $SiHCl_3$, $SiH_2Cl_2$(DCS), and $SiH_3Cl$, and a bromine-containing silicon gas such as $SiBr_4$, $SiHBr_3$, $SiH_2Br$, and $SiH_3Br$. Further, the seed layer 103 is not limited to any one of the single layer films described above and may be a stacked film formed by combining the substances described above. As the method of forming the seed layer 103, for example, a Chemical Vapor Deposition (CVD) method may be used. Further, when an aminosilane-based gas is used as the silicon source gas for the seed layer, a temperature at which thermal decomposition does not occur is preferable. Since the seed layer 103 is formed on the substrate 101 as described above, the roughness of an amorphous silicon film 104 formed on the seed layer 103 can be reduced. Further, the amorphous silicon film 104 to be described below may be formed without forming the seed layer 103 on the substrate 101.

Figure 1C:
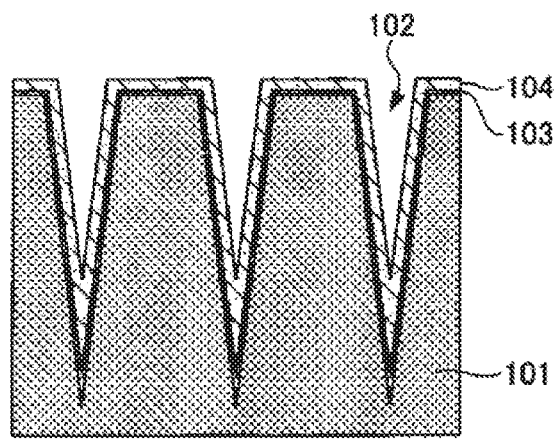

Next, the amorphous silicon film 104 is formed on the seed layer 103 by supplying a silicon source gas to the substrate 101 (see FIG. 1C). In an embodiment, the amorphous silicon film 104 is conformally formed on the seed layer 103 by supplying the silicon source gas to the substrate 101, which has been heated to a predetermined temperature (e.g., 550 degrees C.), through, for example, a CVD method. The amorphous silicon film 104 may be a non-doped silicon film or a silicon film doped with impurities. The impurities may be, for example, boron (B), phosphorus (P), arsenic (As), oxygen (O), and carbon (C). Gases that can be applied to the CVD method may be used as the silicon source gas, and, for example, any one or more combinations among a hydrogenated silicon gas, a halogen-containing gas, and an aminosilane-based gas may be used. The hydrogenated silicon gas may be, for example, $SiH_4$, $Si_2H_6$, and $Si_3H_8$. The halogen-containing silicon gas may be, for example, fluorine-containing silicon gas such as $SiF_4$, $SiHF_3$, $SiH_2F_2$, and $SiH_3F$, chlorine-containing silicon gas such as $SiCl_4$, $SiHCl_3$, $Si_3Cl_2$(DCS), and $SiF_3Cl$, and bromine-containing gas such as $SiBr_4$, $SiHBr_3$, $SiH_2Br_2$, and $SiH_3Br$. The aminosilane-based gas may be, for example, diisopropylamino silane (DIMS), tris(dimethylamino)silane (3DMAS), and bis(tertiary-butylamino)silane (BTBAS). Further, when impurities are doped. $B_2H_6$, $BCl_3$, $PH_3$, and $AsH_3$, for example, may be used as the impurity-containing gas.

Figure 1D:
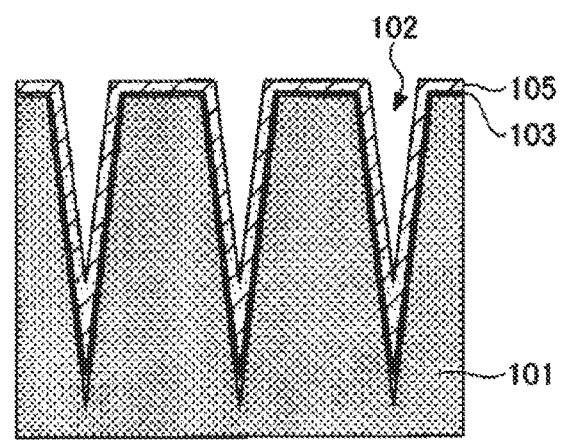

Next, a polycrystalline silicon film 105 is formed by polycrystallizing the amorphous silicon film 104 by performing heat treatment on the amorphous silicon film 104 by heating the substrate 101 at a predetermined temperature (e.g., 600 degrees C. or more) (see FIG. 1D). The heat treatment may be performed, for example, in a vacuum atmosphere or an inert gas atmosphere, but it is preferable that the heat treatment is performed in a hydrogen atmosphere in order not to deteriorate the roughness of the silicon film. Any temperature is possible as the predetermined temperature as long as the amorphous silicon film 104 can be changed to a polycrystalline silicon film. For example, the predetermined temperature may be a temperature equal to or more than a temperature at which the amorphous silicon film 104 is formed. Further, it is preferable that the predetermined temperature is a temperature that is substantially the same as the temperature of the process of forming a polycrystalline silicon film 105 described later. Accordingly, since there is no need to change the temperature when the process proceeds to perform the process of forming the polycrystalline silicon film 105 to be described below, the time required for changing the temperature can be reduced, thereby improving productivity.

Figure 1E:
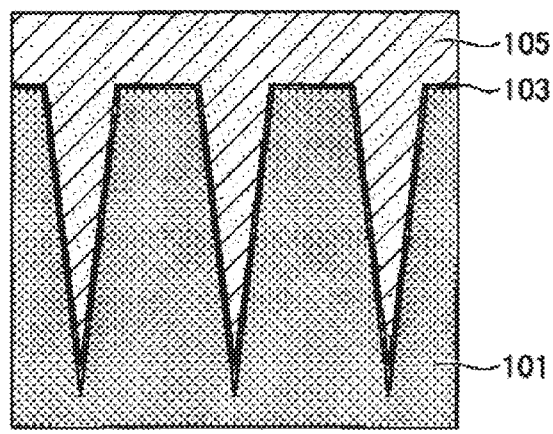

Next, a polycrystalline silicon film 105 is formed to fill the recesses 102 on the polycrystalline silicon film 105, which has been polycrystallized by heat treatment by supplying the silicon source gas to the substrate 101 (see FIG. 1E). In an embodiment, the polycrystalline silicon film 105 is formed to fill the recesses 102 by supplying the silicon source gas to the substrate 101, which has been heated to a temperature (e.g., COO degrees C. or higher) higher than the temperature in the process of forming the amorphous silicon film 104, through, for example, a CVD method.

According to the film forming method of the first embodiment described above, the amorphous silicon film 104 is formed in the recesses 102, the polycrystalline silicon film 105 is formed by heat treatment, and then the polycrystalline silicon film 105 is formed in the recesses 102 to fill the recesses 102. With this configuration, since the recesses 102 are not filled when the amorphous silicon film 104 is subjected to heat treatment, almost no force is applied in the direction in which the width of the recess 102 is reduced, even if hydrogen is desorbed from the amorphous silicon film 104 by the heat treatment of the amorphous silicon film 104 to allow film contraction. Accordingly, warpage of the substrate 101 can be suppressed. Further, since the silicon film filling the recesses 102 is polycrystalline, even if, for example, the substrate 101 is exposed to a high temperature (e.g., 700 degrees C. or more) in later processes, it is difficult for hydrogen to be desorbed from the film. Accordingly, warpage of the substrate 101 can be suppressed in later processes.

Figure 2A:
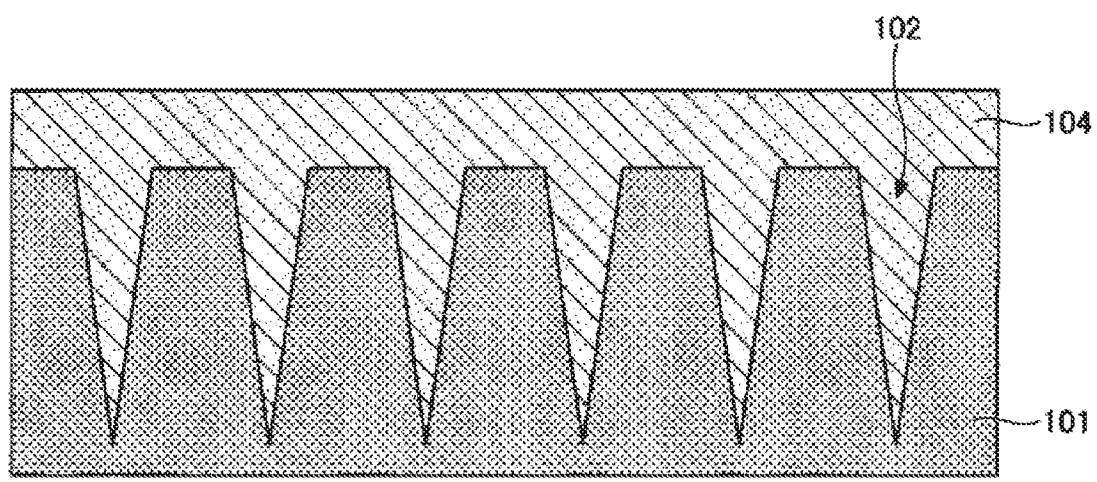
FIGS. 2A and 2B are views illustrating the effect of the film forming method of the first embodiment.
Figure 2B:
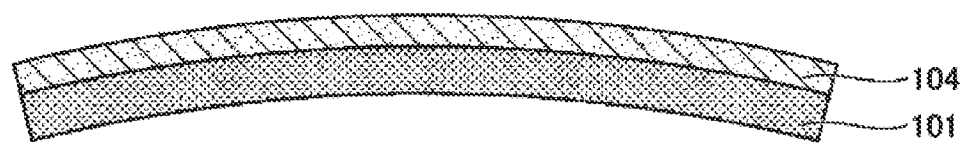
Figure 3A:
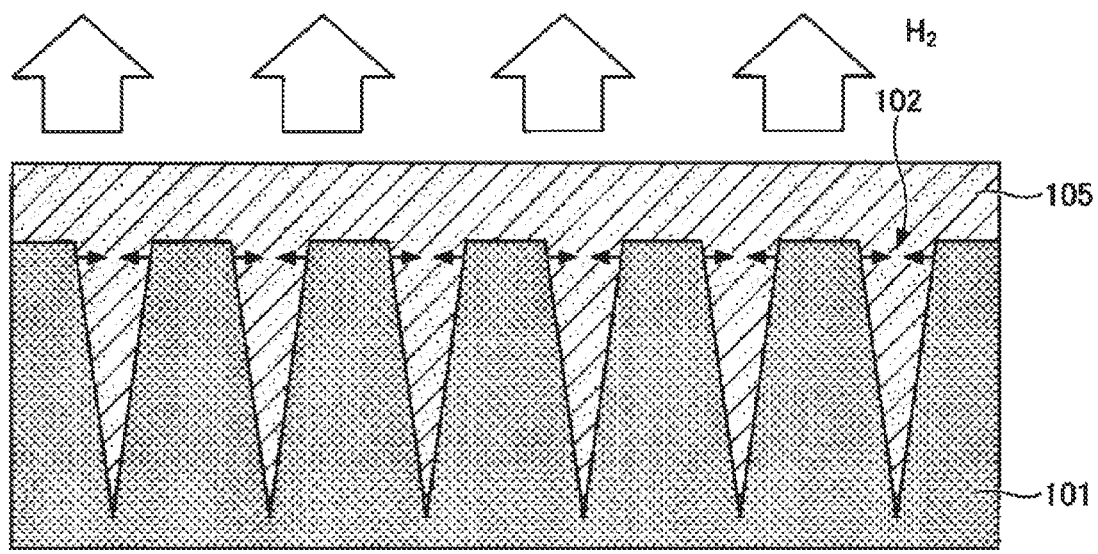
FIGS. 3A and 3B are views illustrating the effect of the film forming method of the first embodiment.
Figure 3B:
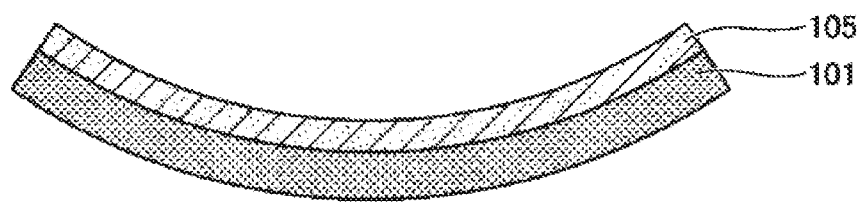

On the other hand, for example, when the recesses 102 of the substrate 101 are filled with the amorphous silicon film 104 as shown in FIG. 2A, the filling characteristics are good, but, as shown in FIG. 2B, the substrate 101 becomes warped such that the surface on which the amorphous silicon film 104 is formed becomes convex. Further, for example, in later processes, when the substrate 101 is exposed to a high temperature (e.g., 700 degrees C. or more), the amorphous silicon film 104 is polycrystallized, so that the polycrystalline silicon film 105 is formed. At this time, as indicated by an arrow in FIG. 3A, a force is applied in the direction in which the width of the recess 102 is reduced due to desorption of hydrogen $H_2$ from the film. Accordingly, as shown in FIG. 3B, a severe warpage occurs in the substrate 101 in which the surface on which the polycrystalline silicon film 105 is formed in the recesses 102 becomes concave. When the substrate 101 becomes severely warped as described above, it is difficult to move or mount the substrate 101 to other places. Further, the larger the ratio of the recesses 102 occupying the surface area is and the larger the aspect ratio is, the more the substrate 101 bends.

On the other hand, in terms of reduction of warpage of the substrate 101 only, it may be conceivable to form the polycrystalline silicon film directly in the recesses 102. However, when a substrate surface on which a polycrystalline silicon film is formed is, for example, a surface of an insulating film and a polycrystalline silicon film is directly formed on the substrate surface, the film becomes a film with a very large surface roughness, and accordingly, the filling characteristics are degraded. Accordingly, warpage and filling are difficult to be compatible with each other. However, as in the film forming method of the first embodiment, a polycrystalline silicon film polycrystallized through heat treatment after an amorphous silicon film with a small roughness is formed can maintain a state of small roughness. Further, polycrystalline silicon that is formed on the polycrystalline silicon film with a small roughness can be formed into a film while maintaining the small roughness. Accordingly, it is possible to form a silicon film with good filling characteristics.

Further, although a case in which the recesses 102 are filled with a silicon film is described in the above example, the present disclosure is not limited thereto. For example, the film forming method can be applied even when the recesses 102 are filled with a germanium film and a silicon germanium film. The germanium film and the silicon germanium film may be, for example, non-doped films or doped films.

When a germanium film is filled, for example, a germanium source gas may be used instead of the silicon source gas. Further, for example, a halogen-containing germanium gas may be used instead of the halogen-containing silicon gas. Further, for example, a hydrogenated germanium gas may be used instead of the hydrogenated silicon gas. Further, for example, an aminogermanium-based gas may be used instead of the aminosilane-based gas.

The halogen-containing germanium gas may include, for example, fluorine-containing germanium gas such as $GeF_4$, $GeHF_3$, $GeH_2F_2$, and $GeH_3F$, a chlorine-containing germanium gas such as $GeCl_4$, $GeHCl_3$, $GeH_2Cl_2$, and $GeH_3Cl$, and bromine-containing gas such as $GeBr_4$, $GeHBr_3$, $GeH_2Br_2$, and $GeH_3Br$. The hydrogenated germanium gas may include, for example, $GeH_4$, $Ge_2H_6$, and $Ge_3H_8$. The aminogermanium-based gas may include, for example, dimethylamino germane (DMAG), diethylamino germane (DEAG), bis (dimethylamino germane (BDMAG), his (dimethylamino germane) (BDEAG), and tris dimethylamino germane (3DMAG).

When a silicon germanium film is filled, for example, a silicon source gas and a germanium source gas may be used instead of the silicon source gas. Further, for example, a halogen-containing silicon gas and a halogen-containing germanium gas may be used instead of the halogen-containing silicon gas. Further, for example, a hydrogenated silicon gas and a hydrogenated germanium gas may be used instead of the hydrogenated silicon gas. Further, for example, an aminosilane-based gas and an aminogermanium-based gas may be used instead of the aminosilane-based gas.

Second Embodiment

A film forming method according to a second embodiment is described with reference to FIGS. 4A to 4E. FIGS. 4A to 4E are process cross-sectional views showing a film forming method according to the second embodiment.

First, a substrate 201 having recesses 202 on the surface is prepared (see FIG. 4A), The substrate 201 and the recesses 202 may be the same as the substrate 101 and the recesses 102 in the first embodiment. An insulating film such as a silicon oxide film ($SiO_2$ film) or a silicon nitride film (SiN film) may be formed on the surfaces of the recesses 202.

Figure 4A:
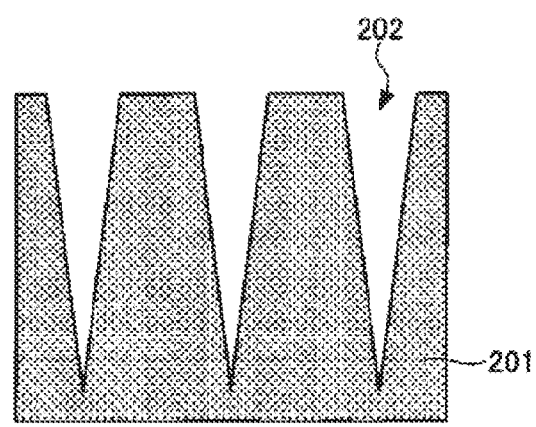
FIGS. 4A to 4E are process cross-sectional views showing a film forming method according to a second embodiment.
Figure 4B:
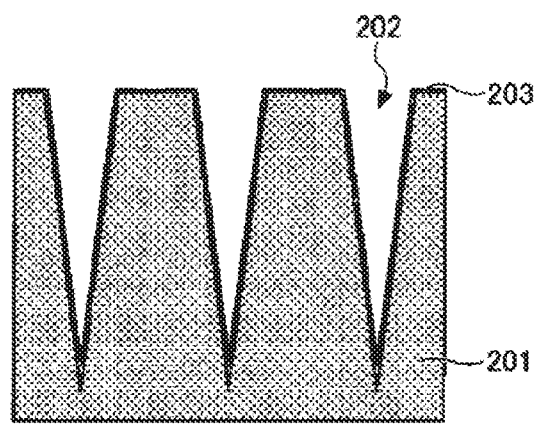

Next, a seed layer 203 is formed on the substrate 201 by supplying a silicon source gas for the seed layer to the substrate 201 (see FIG. 4B). The method of forming the seed layer 203 may be the same as the method of forming the seed layer 103 in the first embodiment. Further, an amorphous silicon film 204 to be described below may be formed without forming the seed layer 203 on the substrate 201.

Next, the amorphous silicon film 204 is formed on the seed layer 203 by supplying the silicon source gas to the substrate 201. The method of forming the amorphous silicon film 204 may be the same as the method of forming the amorphous silicon film 104 in the first embodiment.

Figure 4C:
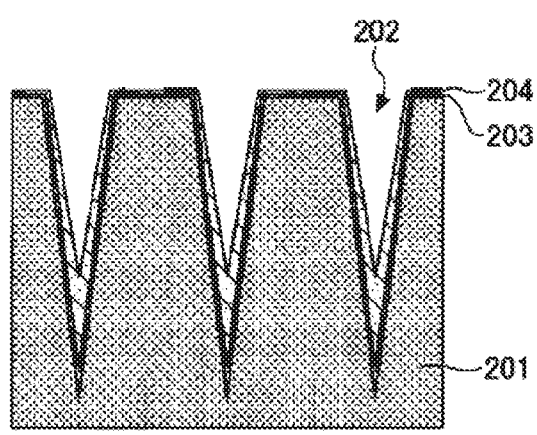

Next, the amorphous silicon film 204 is etched such that the film thickness becomes larger at the lower portions than the upper portions of the recesses 202 by supplying a halogen-containing etching gas to the substrate 201 (see FIG. 4C), Accordingly, the opening at the upper portion of the recess 202 is widened. Further, although a case in which the amorphous silicon film 204 remains on the top surface of the recess 202 is shown in FIG. 4C, the top surface of the recess 202 may be exposed. The halogen-containing etching gas may include, for example, $Cl_2$, HCl, $F_2$, $Br_2$, HBr, and HI and may be a gas mixture thereof.

Figure 4D:
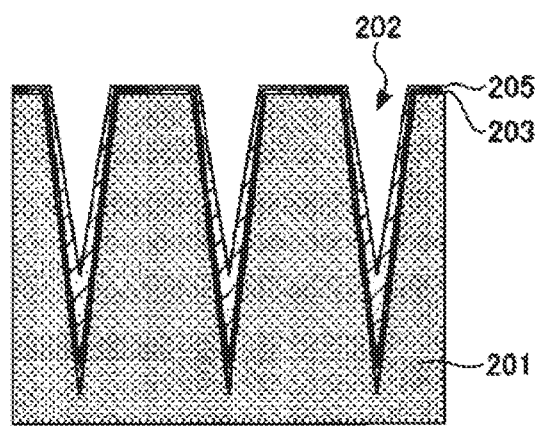

Next, a polycrystalline silicon film 205 is formed by polycrystallizing the amorphous silicon film 204 by performing heat treatment on the amorphous silicon film 204 by heating the substrate 201 to a predetermined temperature (see FIG. 4D). The condition of the heat treatment may be the same as the condition of the heat treatment in the first embodiment.

Figure 4E:
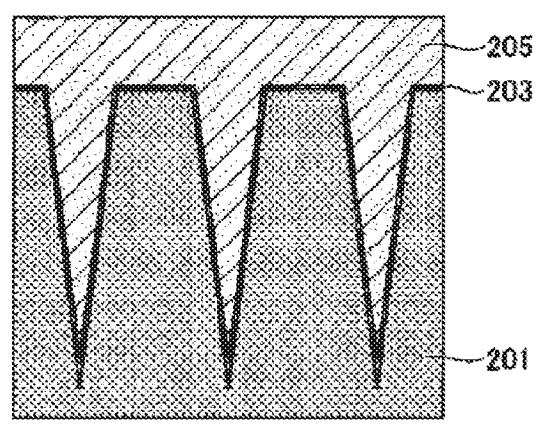

Next, a polycrystalline silicon film 205 is formed to fill the recesses 202 on the polycrystalline silicon film 205 poly crystallized by the heat treatment by supplying the silicon source gas to the substrate 201 and then performing heat treatment (see FIG. 4E). The method of forming the polycrystalline silicon film 205 may be the same as the method of forming the polycrystalline silicon film 105 in the first embodiment.

According to the film forming method of the second embodiment described above, the amorphous silicon film 204 is formed on the recesses 202, the polycrystalline silicon film 205 is formed by heat treatment, and then the polycrystalline silicon film 205 is formed on the recesses 202 to fill the recesses 202. Accordingly, since the recesses 202 are not filled when the amorphous silicon film 204 is subjected to the heat treatment, almost no force is applied in the direction in which the width of the recesses 202 is reduced, even if film contraction occurs due to desorption of hydrogen from the film when performing the heat treatment on the amorphous silicon film 204. Accordingly, warpage of the substrate 201 can be suppressed. Further, since the silicon film filling the recesses 202 is polycrystalline, for example, in later processes, even if the substrate 201 is exposed to a high temperature (e.g., 700 degrees C. or more), desorption of hydrogen from the film hardly occurs. Accordingly, warpage of the substrate 201 can be suppressed in later processes.

Further, in the second embodiment, a process of etching the amorphous silicon film 204 such that the film thickness becomes larger at the lower portions than the upper portions of the recesses 202 is performed between the process of forming the amorphous silicon film 204 on the recesses 202 and the process of performing the heat treatment on the amorphous silicon film 204. Accordingly, the openings at the upper portions of the recesses 202 are widened, as compared with the case in which the process of etching the amorphous silicon film 204 is not performed. Therefore, it is possible to suppress a void or a seam that is generated in the recesses 202 when the recesses 202 are filled with the polycrystalline silicon film 205.

Third Embodiment

A film forming method according to a third embodiment is described with reference to FIGS. 5A to 5G. FIGS. 5A to 5G are process cross-sectional views showing the film forming method according to a third embodiment.

Figure 5A:
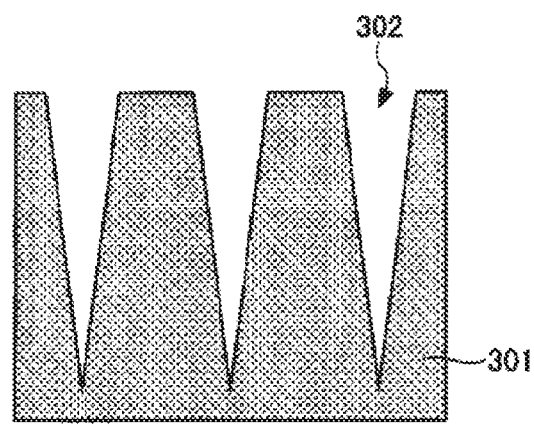
FIGS. 5A to 5G are process cross-sectional views showing a film forming method according to a third embodiment.

First, a substrate 301 having recesses 302 on the surface is prepared (see FIG. 5A). The substrate 301 and the recesses 302 may be the same as the substrate 101 and the recesses 102 in the first embodiment. An insulating film such as a silicon oxide film ($SiO_2$ film) or a silicon nitride film (SiN film) may be formed on the surfaces of the recesses 302.

Figure 5B:
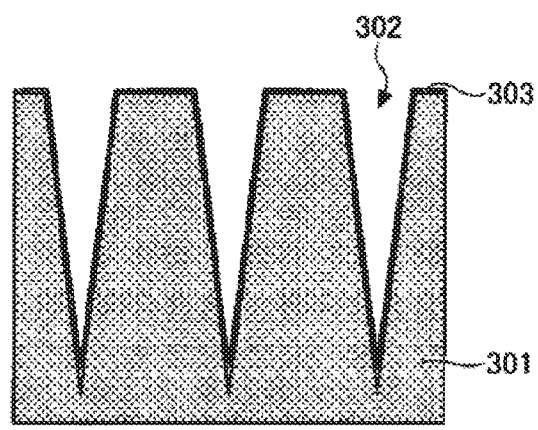

Next, a seed layer 303 is formed on the substrate 301 by supplying a silicon source gas for the seed layer to the substrate 301 (see FIG. 5B). The method of forming the seed layer 303 may be the same as the method of forming the seed layer 103 in the first embodiment. Further, an amorphous silicon film 304 to be described below may be formed without forming the seed layer 303 on the substrate 301.

Next, the amorphous silicon film 304 is formed on the seed layer 303 by supplying the silicon source gas to the substrate 301. The method of forming the amorphous silicon film 304 may be the same as the method of forming the amorphous silicon film 104 in the first embodiment.

Figure 5C:
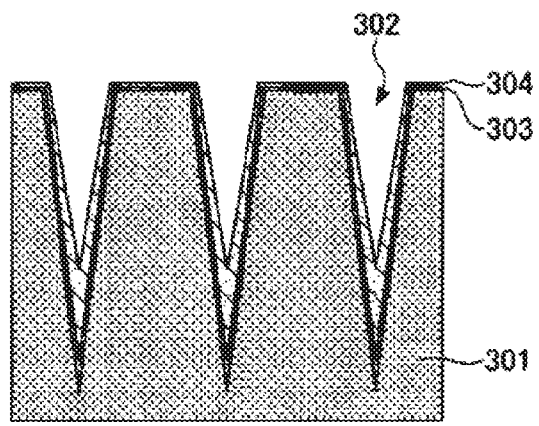

Next, the amorphous silicon film 304 is etched such that the film thickness becomes larger at the lower portions than the upper portions of the recesses 302 by supplying a halogen-containing etching gas to the substrate 301 (see FIG. 5C). Accordingly, the openings at the upper portions of the recess 302 are widened. The method of etching the amorphous silicon film 304 may be the same as the method of etching the amorphous silicon film 204 in the second embodiment.

Figure 5D:
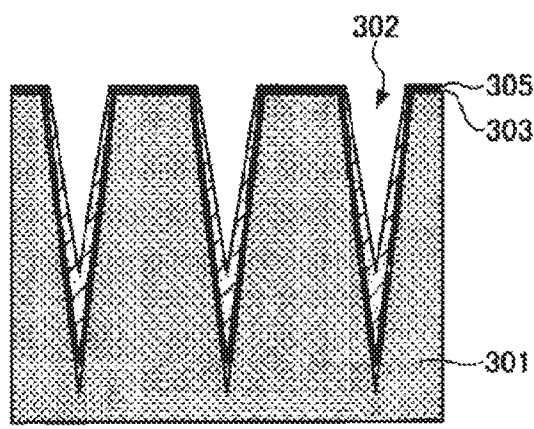

Next, a polycrystalline silicon film 305 is formed by polycrystallizing the amorphous silicon film 304 by performing heat treatment on the amorphous silicon film 304 by heating the substrate 301 to a predetermined temperature (see FIG. 5D). The condition of the heat treatment may be the same as the condition of the heat treatment in the first embodiment.

Next, an amorphous silicon film 304 is formed on the polycrystalline silicon film 305 by supplying the silicon source gas to the substrate 301. The method of forming the amorphous silicon film 304 may be the same as the method of forming the amorphous silicon film 104 in the first embodiment.

Figure 5E:
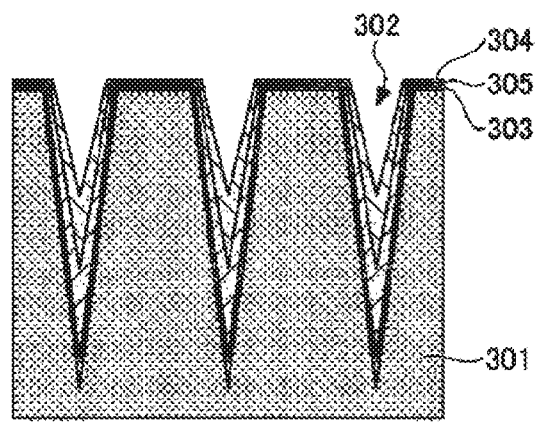

Next, the amorphous silicon film 304 is etched such that the film thickness becomes larger at the lower portions than the upper portions of the recesses 302 by supplying halogen-containing etching gas to the substrate 301 (see FIG. 5E). Accordingly, V-shapes in which the upper portions of the recesses 302 are wide and the lower portions of the recesses 302 are filled are formed. The method of etching the amorphous silicon film 304 may be the same as the method of etching the amorphous silicon film 204 in the second embodiment.

Figure 5F:
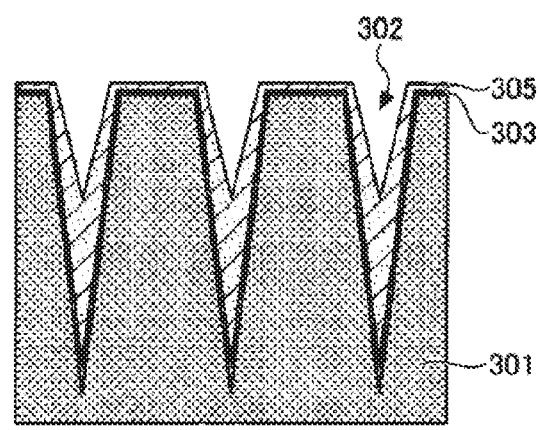

Next, a polycrystalline silicon film 305 is formed by polycrystallizing the amorphous silicon film 304 by performing heat treatment on the amorphous silicon film 304 by heating the substrate 301 to a predetermined temperature (see FIG. 5F). The condition of the heat treatment may be the same as the condition of the heat treatment in the first embodiment.

Figure 5G:
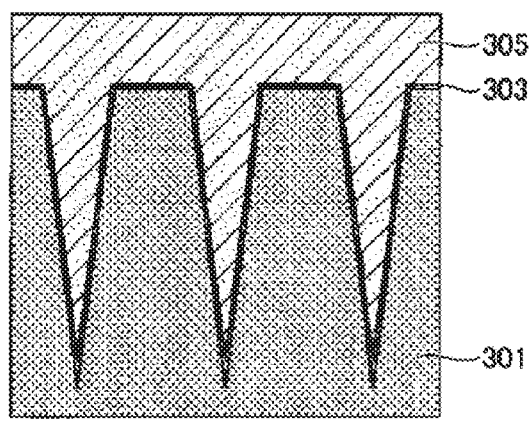

Next, a polycrystalline silicon film 305 is formed to fill the recesses 302 on the polycrystalline silicon film 305 polycrystallized by the heat treatment by supplying the silicon source gas to the substrate 301 (see FIG. 5G). The method of forming the polycrystalline silicon film 305 may be the same as the method of forming the polycrystalline silicon film 105 in the first embodiment.

According to the film forming method of the third embodiment described above, the amorphous silicon film 304 is formed on the recesses 302, the polycrystalline silicon film 305 is formed by heat treatment, and then the polycrystalline silicon film 305 is formed on the recesses 302 to fill the recesses 302. Accordingly, since the recesses 302 are not filled when the amorphous silicon film 304 is subjected to the heat treatment, almost no force is applied in the direction in which the width of the recesses 302 is reduced, even if film contraction occurs due to desorption of hydrogen from the film by the heat treatment of the amorphous silicon film 304. Accordingly, warpage of the substrate 301 can be suppressed. Further, since the silicon film filling the recesses 302 is polycrystalline, for example, in later processes, even if the substrate 301 is exposed to a high temperature (e.g., 700 degrees C. or more), desorption of hydrogen from a film hardly occurs. Accordingly, warpage of the substrate 301 can be suppressed in later processes.

Further, in the third embodiment, the process of forming the amorphous silicon film 304 on the recesses 302, the process of etching the amorphous silicon film 304 such that the film thickness becomes larger at the lower portions than the upper portions of the recesses 302, and the process of performing the heat treatment on the amorphous silicon film 304 are performed twice in this order. Therefore, it is possible to particularly suppress a void or a seam that is generated in the recesses 302 when the recesses 302 are filled with the polycrystalline silicon film 305. Further, warpage of the substrate 301 can be particularly suppressed in later processes.

Further, a case in which a cycle that performs the process of forming the amorphous silicon film 304, the process of etching the amorphous silicon film 304, and the process of performing the heat treatment on the amorphous silicon film 304 in this order is repeated twice is described in the above example, but the present disclosure is not limited thereto. For example, the cycle may be performed three times or more. The number of the cycles may depend, for example, on the shape of the recesses 302. For example, when the shape of the recesses 302 is complicated, for example, when the openings of the recesses 302 are narrow or the recesses 302 have a barrel-shaped cross-sectional shape, it is preferable to perform the cycle a plurality of times. Accordingly, it is possible to suppress a void or a seam that is formed in the recesses 302.

Fourth Embodiment

A film forming method according to a fourth embodiment is described with reference to FIGS. 6A to 6H. FIGS. 6A to 6H are process cross-sectional views showing a film forming method according to the fourth embodiment.

Figure 6A:
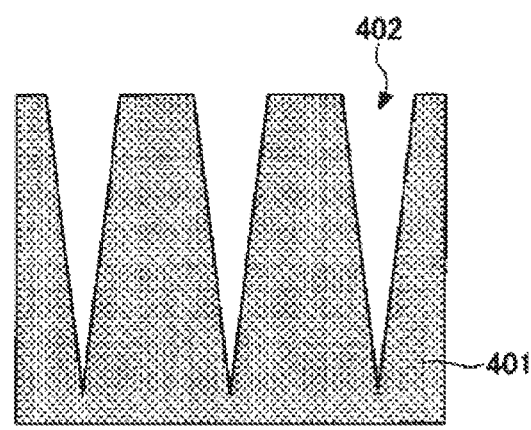
FIGS. 6A to 6H are process cross-sectional views showing a film forming method according to a fourth embodiment.

First, a substrate 401 having recesses 402 on the surface is prepared (see FIG. 6A). The substrate 401 and the recesses 402 may be the same as the substrate 101 and the recesses 102 in the first embodiment. An insulating film such as a silicon oxide film ($SiO_2$ film) or a silicon nitride film (SiN film) may be formed on the surfaces of the recesses 402.

Figure 6B:
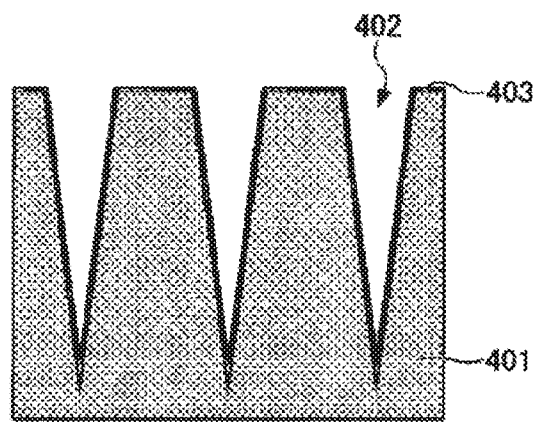
Figure 6C:
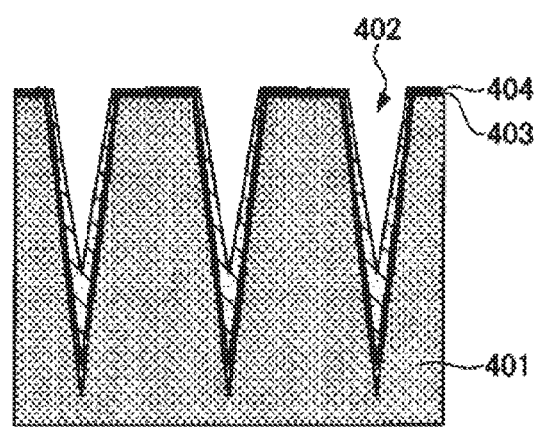
Figure 6D:
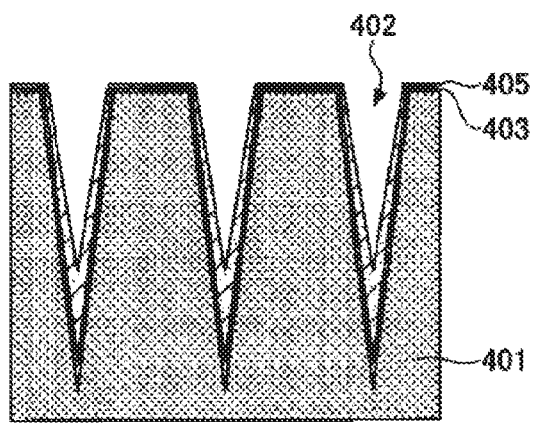

Next, a seed layer 403 is formed on the substrate 401 by supplying a silicon source gas for the seed layer to the substrate 401 (see FIG. 6B). The method of forming the seed layer 403 may be the same as the method of forming the seed layer 103 in the first embodiment. Further, an amorphous silicon film 404 to be described below may be formed without forming the seed layer 403 on the substrate 401.

Next, the amorphous silicon film 404 is formed on the seed layer 403 by supplying the silicon source gas to the substrate 401. The method of forming the amorphous silicon film 404 may be the same as the method of forming the amorphous silicon film 104 in the first embodiment.

Next, the amorphous silicon film 404 is etched such that the film thickness becomes larger at the lower portions than the upper portions of the recesses 402 by supplying a halogen-containing etching gas to the substrate 401 (see FIG. 6C), Accordingly, the openings at the upper portions of the recess 402 are widened. The method of etching the amorphous silicon film 404 may be the same as the method of etching the amorphous silicon film 204 in the second embodiment.

Next, a polycrystalline silicon film 405 is formed by polycrystallizing the amorphous silicon film 404 by performing heat treatment on the amorphous silicon film 404 by heating the substrate 401 to a predetermined temperature (see FIG. CD). The condition of the heat treatment may be the same as the condition of the heat treatment in the first embodiment.

Figure 6E:
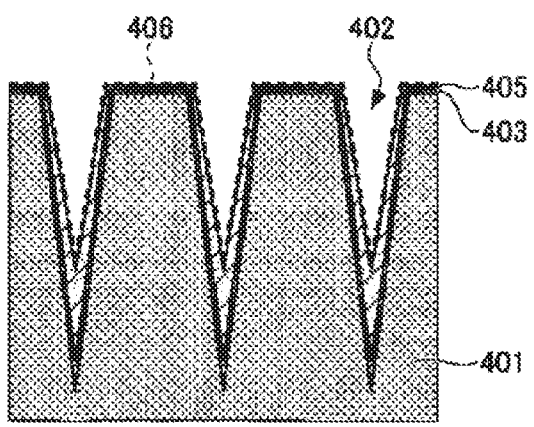

Next, an inhibition layer 406 that inhibits crystal growth is formed on the surface of the polycrystalline silicon film 405 (see FIG. 6E). The inhibition layer 406 is formed, for example, by performing a modifying treatment that modifies the surface of the polycrystalline silicon film 405. The modifying treatment may be, for example, a treatment that oxidizes the surface of the polycrystalline silicon film 405 by supplying an oxidizer to the substrate 401 or a treatment that forms a doped layer on the surface of the polycrystalline silicon film 405 by supplying a dopant to the substrate 401. The oxidizer may be, for example, an oxidizing gas such as oxygen ($O_2$) or a nitrous oxide ($N_2O$). The dopant may include, for example, a diborane ($B_2H_6$) or phosphine ($PH_3$) gas. Further, the inhibition layer 406 may be formed, for example, by forming a film that inhibits crystal growth on the surface of the polycrystalline silicon film 405. The method of forming the film that inhibits crystal growth may be, for example, a process of forming an amorphous silicon film on the surface of the polycrystalline silicon film 405 under a condition in which in-film hydrogen concentration is higher than that in the process of forming the amorphous silicon film 404 described above. For example, a high-order hydrogenated silicon gas containing much more hydrogen than the process of forming the amorphous silicon film 404 is used as the silicon source gas. Further, a method of forming a film at a temperature lower than that in the process of forming the amorphous silicon film 404 may be also used. A method in which a hydrogen-containing gas and a silicon source gas are supplied at the same time may be also used.

Next, an amorphous silicon film 404 is formed on the inhibition layer 406 by supplying the silicon source gas to the substrate 401. The method of forming the amorphous silicon film 404 may be the same as the method of forming the amorphous silicon film 104 in the first embodiment.

Figure 6F:
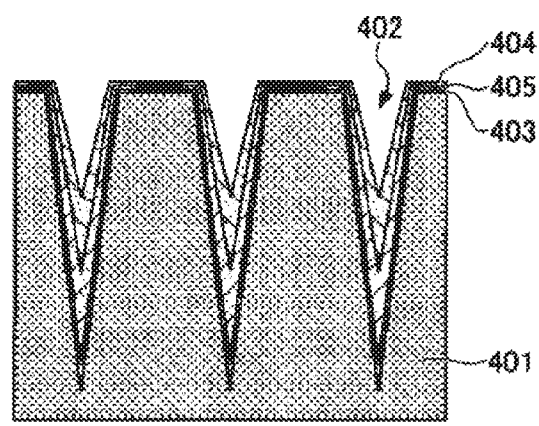

Next, the amorphous silicon film 404 is etched such that the film thickness becomes larger at the lower portions than the upper portions of the recesses 402 by supplying a halogen-containing etching gas to the substrate 401 (see FIG. 6F). Accordingly, V-shapes in which the upper portions of the recesses 402 are wide and the lower portions of the recesses 402 are filled are formed. The method of etching the amorphous silicon film 404 may be the same as the method of etching the amorphous silicon film 204 in the second embodiment.

Figure 6G:
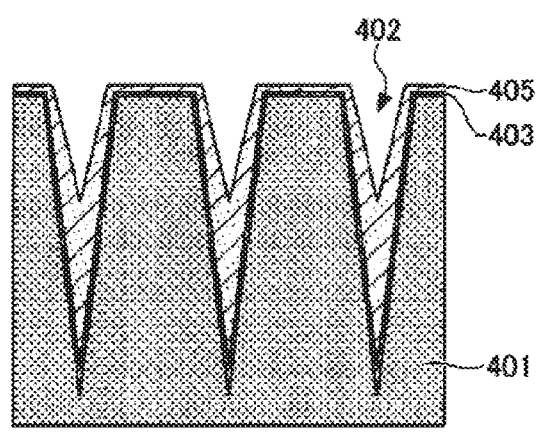

Next, a polycrystalline silicon film 405 is formed by polycrystallizing the amorphous silicon film 404 by performing heat treatment on the amorphous silicon film 404 by heating the substrate 401 to a predetermined temperature see FIG. 6G). The condition of the heat treatment may be the same as the condition of the heat treatment in the first embodiment.

Figure 6H:
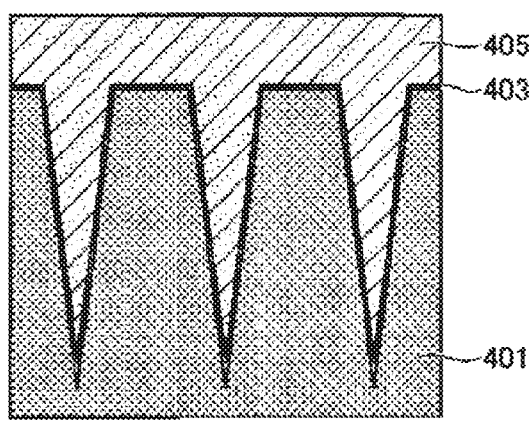

Next, a polycrystalline silicon film 405 is formed to fill the recesses 402 on the polycrystalline silicon film 405 polycrystallized by the heat treatment by supplying the silicon source gas to the substrate 401 (see FIG. 6H). The method of forming the polycrystalline silicon film 405 may be the same as the method of forming the polycrystalline silicon film 105 in the first embodiment.

According to the film forming method of the fourth embodiment described above, the amorphous silicon film 404 is formed on the recesses 402, the polycrystalline silicon film 405 is formed by heat treatment, and then the polycrystalline silicon film 405 is formed on the recesses 402 to fill the recesses 402. Accordingly, since the recesses 402 are not filled when the amorphous silicon film 404 is subjected to the heat treatment, almost no force is applied in the direction in which the width of the recesses 402 is reduced, even if film contraction occurs due to desorption of hydrogen from the film by the heat treatment of the amorphous silicon film 404. Accordingly, warpage of the substrate 401 can be suppressed. Further, since the silicon film filling the recesses 402 is polycrystalline, for example, in later processes, even if the substrate 401 is exposed to a high temperature (e.g., 700 degrees C. or more), desorption of hydrogen from the film hardly occurs. Accordingly, warpage of the substrate 401 can be suppressed in later processes.

Further, in the fourth embodiment, the process of forming the amorphous silicon film 404 on the recesses 402, the process of etching the amorphous silicon film 404 such that the film thickness becomes larger at the lower portions than the upper portions of the recesses 402, and the process of performing the heat treatment on the amorphous silicon film 404 are performed twice in this order. Therefore, it is possible to particularly suppress a void or a seam that is generated in the recesses 402 when the recesses 402 are filled with the polycrystalline silicon film 405.

Further, in the fourth embodiment, the process of forming the inhibition layer 406 which inhibits crystal growth on the surface of the polycrystalline silicon film 405 formed by heat treatment is performed between the process of firstly performing the heat treatment on the amorphous silicon film 404 and the process of secondly forming the amorphous silicon film 404. Accordingly, the amorphous silicon film 404 can be easily formed even on the polycrystalline silicon film 405 formed by heat treatment. Therefore, since the silicon film that is etched in the etching process is amorphous, etching can be performed with good roughness, and accordingly, better filling can be performed.

Further, a case in which a cycle that performs the process of forming the amorphous silicon film 404, the process of etching the amorphous silicon film 404, and the process of performing heat treatment on the amorphous silicon film 404 is repeated twice in this order is described in the above example, but the present disclosure is not limited thereto. For example, the cycle may be performed three times or more. The number of the cycles may depend on, for example, the shape of the recesses 402. For example, when the shape of the recesses 402 is complicated, for example, when the openings of the recesses 402 are narrow or the recesses 402 have a barrel-shaped cross-sectional shape, it is preferable to perform the cycle a plurality of times. Accordingly, it is possible to suppress a void or a seam that is formed in the recesses 402.

[Heat Treatment Apparatus]

A heat treatment apparatus that can perform the above-described film forming method is described by exemplifying a batch type apparatus that performs heat treatment on a plurality of substrates at once. However, the heat treatment apparatus is not limited to the batch type apparatus. For example, a single wafer type processing apparatus that processes substrates one by one may be used. Further, for example, a semi-batch type apparatus that forms a film on a substrate by passing the substrate sequentially through a region in which a source gas is supplied and a region in which a reacting gas reacting with the source gas is supplied, by revolving a plurality of wafers disposed on a rotary table in a process container may be used.

Figure 7:
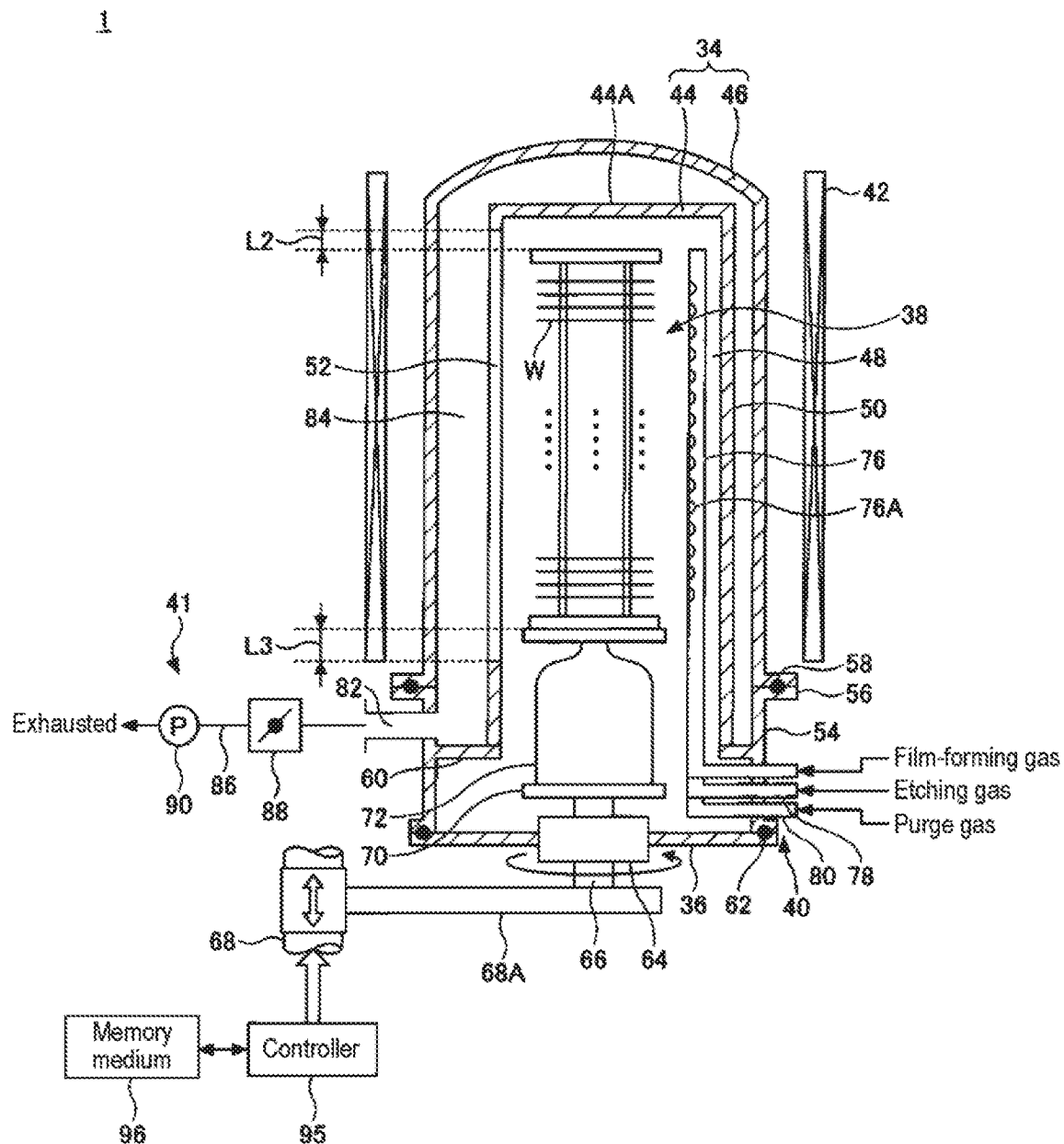
FIG. 7 is a view showing an example of a heat treatment apparatus for performing the film forming method of an embodiment.

FIG. 7 is a view showing an example of a heat treatment apparatus for performing the film forming method of an embodiment. FIG. 8 is a view illustrating a process container of the heat treatment apparatus of FIG. 7.

As shown in FIG. 7, a heat treatment apparatus 1 includes a process container 34, a cover 36, a wafer boat 38, a gas supply 40, an exhauster 41, and a heater 42.

The process container 34 is a process container that accommodates the wafer boat 38. The wafer boat 38 is a substrate holder that holds a plurality of semiconductor wafers (hereafter, referred to as wafers W) with predetermined separations. The process container 34 has an inner tube having a cylindrical shape with a ceiling and an open lower end, and an outer tube 46 having a cylindrical shape with a ceiling, which covers the outer side of the inner tube 44, and an open lower end. The inner tube 44 and the outer tube 46 are made of a heat resistance material such as quartz and are coaxially disposed to form a double tube structure.

The ceiling 44A of the inner tube 44 is formed, for example, to be flat. A nozzle accommodation part 48 which accommodates a gas supply pipe is formed at a side of the inner tube 44 along the longitudinal direction (vertically). For example, as shown in FIG. 8, a protruding portion 50 is formed by protruding a portion of the side wall of the inner tube 44 in an outward direction and the inside of the protruding portion 50 functions as the nozzle accommodation part 48. A rectangular opening 52 having a width L1 is formed in the longitudinal direction (vertically) on the opposite side of the inner tube 44 to the nozzle accommodating part 48, facing the nozzle accommodation part 48.

The opening 52 is a gas exhaust hole formed to be able to discharge the gas in the inner tube 44. The opening 52 vertically extends such that the length thereof is the same as the length of the wafer boat 38 or larger than the length of the wafer boat 38. That is, the upper end of the opening 52 is positioned higher than the position corresponding to the upper end of the wafer boat 38 and the lower end of the opening 52 extends to be positioned lower than the position corresponding to the lower end of the wafer boat 38. In detail, as shown in FIG. 7, the distance L2 in the height direction between the upper end of the wafer boat 38 and the upper end of the opening 52 is in the range of about 0 mm to 5 mm. Further, the distance L3 in the height direction between the lower end of the wafer boat 38 and the lower end of the opening 52 is in the range of about 0 mm to 350 mm.

The lower end of the process container 34 is supported by a cylindrical manifold 54 that is made of, for example, stainless steel. A flange 56 is formed at the upper end of the manifold 54 and the lower end of the outer tube 46 is installed and supported on the flange 56. A sealing member 58 such as an O-ring is disposed between the flange 56 and the lower end of the outer tube 46, thereby making the inside of the outer tube 46 hermetic.

A circular ring-shaped support 60 is formed on the inner wall of the upper portion of the manifold 54 and the lower end of the inner tube 44 is installed and supported on the support 60. The cover 36 is hermetically installed in the opening of the lower end of the manifold 54 while disposing a sealing member 62 such as an O-ring between them, and the opening of the lower end of the process container 34, that is, the opening of the manifold 54, is hermetically closed. The cover 36 is made of, for example, stainless steel.

A rotary shaft 66 passes through the center of the cover 36 via a magnetic fluid sealing part 64. The lower portion of the rotary shaft 66 is rotatably supported by an arm 68A of an elevator 68 which is a boat elevator.

A rotary plate 70 is disposed at the upper end of the rotary shaft 66 and the wafer boat 38 holding the wafer W is loaded on the rotary plate 70 through a heat-retention table 72 made of quartz. Accordingly, when the elevator 68 is moved up/down, the cover 36 and the wafer boat 38 are integrally moved up/down, so that the wafer boat 38 can be easily inserted and separated with respect to the inside of the process container 34.

The gas supply 40 is disposed at the manifold 54 and introduces a film-forming gas, a processing gas such as an etching gas, or a purge gas into the inner tube 44. The gas supply 40 has a plurality of (e.g., three) gas supply pipes 76, 78, and 80 made of quartz. The gas supply pipes 76, 78, and 80 are disposed longitudinally in the inner tube 44, and the base ends are bent in an L-shape and supported through the manifold 54.

The gas supply pipes 76, 78, and 80, as shown in FIG. 8, are installed in a line in the circumferential direction in the nozzle accommodation part 48 of the inner tube 44. A plurality of gas holes 76A, 78A, and 80A are formed with predetermined separations in the gas supply pipes 76, 78, and 80 in the longitudinal direction, respectively, such that gases can be discharged horizontally through the gas holes 76A, 78A, and 80A. For example, the predetermined separations are set to be the same as the separations of wafers W supported by the wafer boat 38. Further, the position in the height direction is set such that the respective gas holes 76A, 78A, and 80A are positioned in the middle between wafers W vertically adjacent to one another, so that gases can be efficiently supplied to the spaces between the wafers W. The film-forming gas, the etching gas, and the purge gas are used as the gases, and the gases can be supplied through the gas holes 76A, 78A, and 80A, if necessary, while the flow rates are controlled.

A gas outlet 82 is formed in the side wall of the upper portion of the manifold 54 over the support 60, so the gas in the inner tube 44 discharged from the opening 52 through the space 84 between the inner tube 44 and the outer tube 46 can be discharged. The exhauster 41 is disposed at the gas outlet 82. The exhauster 41 has an exhaust passage 86 connected to the gas outlet 82, and a pressure control valve 88 and a vacuum pump 90 are sequentially installed in the exhaust passage 86, so that the inside of the process container 34 can be evacuated.

The cylindrical heater 42 is disposed outside the outer tube 46 to cover the outer tube 46. The heater 42 heats the wafers W accommodated in the process container 34.

A general operation of the heat treatment apparatus 1 is controlled by a controller 95. The controller 95 may be, for example, a computer, etc. Further, programs of the computer that performs the general operation of the heat treatment apparatus 1 are stored in a memory medium 96. The memory medium 96 may be, for example, a flexible disk, a compact disc, a hard disk, a flash memory, and a DVD.

An example of a filling method of semiconductor film in a wafer W having recesses on the surface of the wafer W by the heat treatment apparatus 1 is described. First, the wafer boat 38 holding a plurality of wafers W is loaded into the process container 34 by the elevator 68 and the opening of the lower end of the process container 34 is hermetically closed by the cover 36. Next, the operations of the gas supply 40, the exhauster 41, the heater 42, etc. are controlled by the controller 95 to perform the methods of forming a film of the first to fourth embodiments described above. Accordingly, it is possible to form a semiconductor film having a good filling characteristic while reducing warpage of the wafers W.

Further, in the embodiments, the amorphous silicon films 104, 204, 304, and 404 are examples of an amorphous semiconductor film and the polycrystalline silicon films 105, 20.5, 305, and 405 are examples of a polycrystalline semiconductor film.

The case in which a substrate is a semiconductor substrate is exemplified in the above embodiments, but the present disclosure is not limited thereto. For example, the substrate may be a large substrate for a Flat Panel Display (FPD) or a substrate for an EL device or a solar cell.

According to the present disclosure, it is possible to form a semiconductor film having good filling characteristics while reducing warpage of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising:
    forming an amorphous semiconductor film on a recess;
    forming a first polycrystalline semiconductor film by performing heat treatment on the amorphous semiconductor film; and
    after the first polycrystalline semiconductor film is formed, forming a second polycrystalline semiconductor film on the first polycrystalline semiconductor film formed by the heat treatment.

2. The method of claim 1, wherein the forming the amorphous semiconductor film comprises conformally forming the amorphous semiconductor film.

3. The method of claim 1, further comprising etching the amorphous semiconductor film such that a film thickness becomes larger at a lower portion than an upper portion of the recess between the forming the amorphous semiconductor film and the forming the first polycrystalline semiconductor film.

4. The method of claim 3, wherein the forming the amorphous semiconductor film, the etching, and the forming the first polycrystalline semiconductor film are repeated a plurality of times.

5. The method of claim 4, further comprising forming an inhibition layer inhibiting crystal growth on a surface of the first polycrystalline semiconductor film formed by the heat treatment.

6. The method of claim 5, wherein the forming the inhibition layer is a process of modifying the surface of the first polycrystalline semiconductor film formed by the heat treatment.

7. The method of claim 5, wherein the forming the inhibition layer is a process of oxidizing the surface of the first polycrystalline semiconductor film formed by the heat treatment.

8. The method of claim 5, wherein the forming the inhibition layer is a process of forming a film on the surface of the first polycrystalline semiconductor film formed by the heat treatment under a condition in which in-film hydrogen concentration is higher than that of the forming the amorphous semiconductor film.

9. The method of claim 1, further comprising forming a seed layer on the recess before the forming the amorphous semiconductor film.

10. The method of claim 1, wherein the heat treatment is performed at a temperature equal to or higher than a temperature of the forming the amorphous semiconductor film.

11. The method of claim 1, wherein the forming the first polycrystalline semiconductor film is performed at a same temperature as a temperature of the forming the second polycrystalline semiconductor film.

12. The method of claim 1, wherein the amorphous semiconductor film is a film including at least one of silicon (Si) and germanium (Ge).

13. A heat treatment apparatus comprising:
    a process container accommodating a substrate having a recess on a surface of the substrate;
    a gas supply supplying a processing gas into the process container;
    a heater heating the substrate; and
    a controller,
    wherein the controller controls the gas supply and the heater to perform:
    forming an amorphous semiconductor film on the recess;
    forming a first polycrystalline semiconductor film by performing heat treatment on the amorphous semiconductor film; and
    after the first polycrystalline semiconductor film is formed, forming a second polycrystalline semiconductor film on the first polycrystalline semiconductor film formed by the heat treatment.

* * * * *